US00RE40424E

(19) United States
(12) Reissued Patent
Han et al.

(10) Patent Number: US RE40,424 E
(45) Date of Reissued Patent: Jul. 8, 2008

(54) STRUCTURE OF DELTA-SIGMA FRACTIONAL TYPE DIVIDER

(75) Inventors: Seon-Ho Han, Daejon-shi (KR); Jang-Hong Choi, Jeollabuk-do (KR); Jae-Hong Jang, Daegu-shi (KR); Hyun-Kyu Yu, Daejon-shi (KR)

(73) Assignee: Electronics and Telecommunications Research Institute, Daijon-shi (KR)

(21) Appl. No.: 11/318,392

(22) Filed: Dec. 22, 2005

Related U.S. Patent Documents

Reissue of:
(64) Patent No.: 6,668,035
Issued: Dec. 23, 2003
Appl. No.: 10/179,840
Filed: Jun. 24, 2002

(30) Foreign Application Priority Data

Dec. 11, 2001 (KR) ..... 2001-78268

(51) Int. Cl.
*H03K 21/00* (2006.01)

(52) U.S. Cl. ..... 377/48; 377/47
(58) Field of Classification Search ..... None
See application file for complete search history.

(56) References Cited

U.S. PATENT DOCUMENTS

| | | | | | |
|---|---|---|---|---|---|
| 5,079,521 | A | | 1/1992 | Gaskell et al. | 331/1 A |
| 5,446,767 | A | | 8/1995 | Nakagawa et al. | 375/376 |
| 5,834,987 | A | * | 11/1998 | Dent | 332/127 |
| 5,903,194 | A | * | 5/1999 | Opsahl et al. | 31/1 A |
| 6,600,378 | B1 | * | 7/2003 | Patana | 331/1 A |
| 6,703,901 | B2 | * | 3/2004 | Jovenin et al. | 331/1 A |

OTHER PUBLICATIONS

*IEEE International Solid–State Circuits Conference, Digest of Technical Papers,* 2000, 200–201.
*IEEE Journal of Solid–State Circuits,* May 1993, 28(5), 553–559.

* cited by examiner

*Primary Examiner*—Tuan T Lam
(74) *Attorney, Agent, or Firm*—Woodcock Washburn LLP

(57) ABSTRACT

The present invention relates to a structure of a delta-sigma fractional type divider. The divider structure adds an external input value and an output value of a delta-sigma modulator to modulate a value of a swallow counter. Therefore, the present invention can provide a delta-sigma fractional type divider the structure is simple and that can obtain an effect of a structure of a delta sigma mode while having a wide-band frequency mixing capability.

15 Claims, 7 Drawing Sheets

STRUCTURE OF DELTA-SIGMA FRACTIONAL TYPE DIVIDER

Matter enclosed in heavy brackets [ ] appears in the original patent but forms no part of this reissue specification; matter printed in italics indicates the additions made by reissue.

*CROSS-REFERENCE TO RELATED APPLICATIONS*

*This application is reissue application of U.S. patent application 10/179,840, filed Jun. 4, 2002, and entitled "Structure of Delta-Sigma Fractional Type Divider," now issued U.S. Pat. No. 6,668,035, which claims priority to Korean Patent Application 2001-78268 filed on Dec. 11, 2001, the contents of which are hereby incorporated by reference in their entirety.*

BACKGROUND OF THE INVENTION

1. Field of the invention

The invention relates generally to a delta-sigma fractional type divider, and more particularly to, a structure of a delta-sigma fractional type divider which is simple, has a wide-band frequency mixing capability and can obtain a delta-sigma mode by maximum.

2. Description of the Prior Art

A frequency synthesizer is a circuit for obtaining necessary frequencies depending on a digital code value. The frequency synthesizer is mainly divided into an integer type frequency synthesizer for producing an output frequency of an integer times using an input frequency of a frequency-phase detector, and a fractional type frequency synthesizer improved in phase, synchronizing time, etc. compared to the integer type frequency synthesizer.

The fractional type frequency synthesizer has a high spur in process of being implemented even though it's various advantages. Thus, the fractional type frequency synthesizer has a current compensation structure using digital-analog converter, a phase interpolation structure, and a delta-sigma structure in order to remove the spur.

The delta-sigma structure disperses the energy of spur generated in a pulse swallowing fraction ratio N frequency synthesizer and transforms the shape of the energy (noise shaping) to implement a high performance frequency synthesizer.

[Dual Modulus Fractional N]

FIG. 1(a) is a block diagram for describing a basic fractional type divider, and FIGS. 1(b) and FIG. 1(c) are waveforms for describing the operation and variations in the difference of the phases of the divider.

The structure of the basic fractional type divider in FIG. 1(a) controls the dual modulus prescaler 1 to produce the division ratio such as below Equation 1 wherein the $T_{p+1}$ is a time section which has the 1/(P+1) division ratio and the $T_P$ is a time section which has the 1/P division ratio.

$$f_{vco} = \left[N + \frac{T_{P+1}}{T_P + T_{P+1}}\right] \cdot f_{ref} = (N \cdot f) \cdot f_{ref} \qquad \text{[Equation 1]}$$

In this process, however, variations in the phase generated in period of 1(.f)*$f_{ref}$ causes to modulate an oscillator through a charge pump and a loop filter, so that a high spur is generated at N*(.f)$f_{ref}$ (N is a positive integer) against the output center frequency of the oscillator. This spur is difficult to remove using the loop filter. Further, the sensitivity of a communication system is decreased by the spur near the output frequency of the oscillator.

The spur can be generated by a control voltage as follows. When the output of the oscillator is $V_{out}(t)=A(t)\cos[w_0t+\Phi(t)]$, the phase noise by the frequency modulation of a control signal Vc(t) can be expressed as follows:

$$V_{out}(t)=A\cdot\cos[(\omega_0+K_{VCO}\cdot V_C(t))\cdot t],$$

$$V_C(t)=A_m\cdot\sin(\omega_{out})$$

$$\omega=\omega_0+K_{VCO}\cdot V_C(t),$$

$$\phi_0 = \int(\omega_0 + K_{VCO}\cdot V_c(t))dt = \omega_0 t + K_{VCO}\int_{-\infty}^{t} V_c(t)\,dt$$

Therefore, $V_{out}(t)$ can be approximated as $$V_{out}(t) \approx A\cos w_0 t - A_m \cdot A \cdot \frac{K_{VCO}}{\omega_m} \cdot \sin\omega_0 t \cdot \sin\omega_m t$$

$$= A\cos\omega_0 t - \frac{A_m A K_{VCO}}{2\omega_m}\{\cos(\omega_0 - \omega_m)t + \cos(\omega_0 + \omega_m)t\}$$

Therefore, spur is generated at to $\omega_0 \pm \omega_m$.

[Multi-Modulus Fractional N]

The dual modulus fractional ratio N can be implemented into a first order delta-sigma. As the dual modulus fractional ratio N has the quantization level of /P and /(P+1) by one bit control, at this time, the energy of spur can be effectively dispersed and reduced. In general, the dual modulus fractional ratio N is implemented into a delta sigma of over third order. In case of designing the dual modulus fractional ratio N having a delta sigma of over third order, a delta-sigma modulator of a mash type that can obtain an effect of transformation of energy shape and can obtain high stability is usually applied to a frequency synthesizer. As an output of the modulator of a mash type is multi-bit, a multi-modulus prescaler is required in order for the dividing circuit to accept it. As a result, the dividing circuit requires complicated dividing unit and control unit.

A process of inducing the mash type structure is first described, and problems in the conventional multi-modulus dividing circuit is then described.

At first, over-sampling (quantization) is described. If quantization errors are white noise, the mean square value is:

$$e_{rms}^2 = \frac{1}{\Delta}\int_{-\Delta/2}^{+\Delta/2} e^2\,de = \frac{\Delta^2}{12}$$

And if the quantized signal is sampled to $f_S$=1/t, the spectral density of a band is:

$$E(f) = e_{rms}\left(\frac{2}{f_s}\right)^{1/2} = e_{rms}\sqrt{2\tau}$$

Noise power of a signal band $0 \leqq f \leqq f_0$ is $$n_0^2 = \int_0^{f_0} e^2(f)\,df = e_{rms}^2(2f_0\tau) = \frac{e_{rms}^2}{OSR}$$

, where $$OSR=f_s/2f_0=1/2f_0t.$$

From the above results, it could be seen that over-sampling reduces the in-bands rms quantization noise($n_0$) to a square root of OSR. Further, it could be seen that the in-band noise is reduced by about 3 dB (corresponding to ½ bit resolution) when the sampling frequency is doubled.

Referring now to FIGS. 2a~FIG. 2c, first order delta-sigma modulation will be described. It was found that quantization using a simple over-sampling and filtering could improve SNR of 3 dB when the sampling frequency is made twice, while the in-band noise of a signal could be more reduced if feedback is introduced to the process.

FIGS. 2a~FIG. 2c are block diagrams of the first order delta-sigma modulator. FIG. 1a illustrates a first order delta-sigma modulator, FIG. 2b illustrates an equivalent model of sampled data and FIG. 2c illustrates a Z-domain model. Analysis for the first order delta-sigma can be :expressed as follows:

$$S(I)=x(I)=y(I),\ w(I+1)=s(I)+w(I),\ y(I)=w(I)\mathbf{30}\ c(I)$$

$$y(I)=x(I)=s(I)=x(I)-[w(I+1)-w(I)]$$

$$w(I)+e(I)=x(I)-w(I+1)+w(I)$$

$$w(I+1)=x(I)-e(I)=y(I+1)-e(I+1)$$

$$y(I)=x(I-1)+e(I)-(I-1)$$

Therefore, $$y(I)=x_{i-1}+(e_i-e_{i-1}).$$

In other words, the delta-sigma shown in FIG. 2 causes to time-delay an original signal so that the original signal can be maintained intact, and reduce quantization errors by differentiation.

In order to obtain the spectral density of $n_i=(e_i-e_{i-1})$, i.e., a noise due to modulation, Z-transform is performed. Thus, as $N(z)=(1-z^{-1})E(z)$ and $z=e^{j\omega L}$ (L is sampling frequency), $$N(f) = E(f)|1 - e^{-j\omega\tau}| = 2e_{rms}\sqrt{2\tau}\,\sin\left(\frac{\omega\tau}{2}\right)$$

Therefore, it could be seen that the noise component of a low frequency can be reduced.

The noise power at the signal band is:

$$n_0^2 = \int_0^{f_0} |N(f)|^2\,df \approx e_{rms}^2\frac{\pi^2}{3}(2f_0\tau)^3,\ f_s^2 \gg f_0^2$$

Also, the rms value is:

$$n_0 = e_{rms}\frac{\pi}{\sqrt{3}}(2f_0\tau)^{3/2} = e_{rms}\frac{\pi}{\sqrt{3}}(OSR)^{-3/2}$$

Thus, it could be seen that a noise is reduced by about 9 dB (corresponding to 1.5 bit resolution) if the over-sampling ratio is doubled. If the input of the delta sigma is a direct current (DC), repetitive noise patterns appear, which is called a patterned noise. And the above equation can be easily obtained through a closed-loop transfer function of a Z-domain model shown in FIG. 2(c).

$$Y(z) = \frac{1/(1-z^{-1})}{1+z^{-1}/(1-z^{-1})}\cdot X(z) + \frac{1}{1+z^{-1}/(1-z^{-1})}\cdot E(z)$$
$$= X(z) + (1-z^{-1})\cdot E(z)$$

The delta sigma performs a noise shaping by which the energy of modulation noise is pushed out to the signal band by a feedback using the integrator. At this time, the characteristic of the integrator determines the shape of the noise spectrum.

Generally, in case that a L-order loop is formed and system is stable, the spectral density is:

$$|N(f)|e_{rms}\sqrt{2\tau}\left(2\sin\left(\frac{\omega\tau}{2}\right)\right)^L$$

In case of OSR>2, the rms noise at the signal band is:

FIG. 3 illustrates a third order delta-sigma (L=3). The rms noise of the $$n_0 = e_{rms}\frac{\pi^L}{\sqrt{2L+1}}(OSR)^{-(L+\frac{1}{2})},\ OSR = 1/2f_0\tau$$

$$n_0 = e_{rms}\frac{\pi^L}{\sqrt{2L+1}}(OSR)^{-(L+\frac{1}{2})},\ OSR = 1/2f_0\tau$$

third order delta-sigma is expressed as

The delta-sigma modulator of this high order can further reduce the quantization noise of a signal band while the delta-sigma structure shown in FIG. 3 has a problem in the stability since it is a control system of a high order constituting a multi-loop. For example, the first and second order delta-sigma modulator has loop gains of 2.0 and 1.33. However, the third order delta-sigma modulator is unstable even having the loop gain of 1.15. The modulator in FIG. 3 has one bit output of +1 and −1, and also has the division ratio at the time region expressed as $$f_{REF} = \frac{f_{VCO}}{N + b(t)},$$

wherein b(t) is a bit stream of the modulator controlling the dual modulus prescaler. Therefore, assuming that the fractional value (DC) to be obtained is K/M and the quantization noise is q(t), $$f_{REF} = \frac{f_{VCO}}{N + \frac{K}{M} + q(t)}$$

At this time, K is a constant of the modulator input and M is the modulus of the modulator adder.

Now, mash type delta-sigma modulator will be described.

The mash structure where a stable first order delta-sigma structure is cascaded has a high-order noise-shaping characteristic and also allows an stable structure to be implemented.

FIG. 4 illustrates the mash type modulator in a Z-domain. At this time, the noise transfer function can be obtained by the following equation.

$$Y_1(z)=(1-z^{-1})E_1(z)+X(z)$$

$$Y_2(z)=-E_1(z)+(1-z^{-1})E_2(z)$$

$$Y_2'(z)=-(1-z^{-1})E_1(z)+(1-z^{-1})^2E_2(z)$$

$$Y_3(z)=-E_2(z)+(1-Z^{-1})E_3(z)$$

$$Y_3'(z)=-(1-z^{-1})E_2(z)+(1-z^{-1})^3E_3(z)$$

Therefore, $$Y(z)=X(z)+(1-z^{-1})^3E_3(z)$$

where the delta-sigma input X(z) is a fractional value of the PLL frequency synthesizer. If the division number of a prescaler is P, $N(z)=P(z)+Y(z)=P(z)+X(z)+(1+z^{-1})^3E_3(z)$ can be obtained. From the above result, it could be seen that the mash type modulator used in the present invention has noise-shaping characteristics.

Most of conventional frequency synthesizers requires a multi-modulus dividing circuit since it uses a mash type modulator having a multi-bit output so that the above stability and a noise shaping effect of a high order can be satisfied.

FIG. 5 illustrates multi-modulus dividing circuit using a conventional direct-convertible counter. The multi-modulus dividing circuit includes a control unit 11 for receiving control signals D0, D1, and a phase selector 13 for producing /4/5/6/7 using the control signals. At this time, D2, D3, D4 and D5 control the division ratio depending on respective code values. The multi-modulus dividing circuit can be implemented in various structure as well as the structure shown in FIG. 5. The multi-modulus division structure, however, requires several dividing circuits 12 such as 2/3, and the like. Further, as control of those dividing circuits must be performed by each of dividing stages. Thus, the multi-modulus division structure has disadvantages that it is complicated and is difficult to be designed.

SUMMARY OF THE INVENTION

The present invention is contrived to solve the above problems and an object of the present invention is therefore to provide a structure of a delta-sigma fractional type divider by which an external input value and an output value of a delta-sigma modulator are added to modulate values of a swallow counter.

In order to accomplish the above object, the present invention is characterized in that is comprises a delta-sigma modulator for receiving a clock signal and a first digital value to perform a delta-sigma modulation, the first digital value being used to program a fractional ratio frequency of a frequency synthesizer, a swallow adder group for receiving an output value of the delta-sigma modulator and a second digital value to add an integer dividing ratio of a swallow counter and the output value of the delta-sigma modulator, the second digital value being used to program an integer ratio frequency of the frequency synthesizer; a program register group for storing an output value of the swallow adder group; and a pulse swallow counter group having a dual modulus prescaler, a program counter and the swallow counter, for dividing an input frequency depending on the value stored by the program register group.

Further, the program register group further comprises a swallow register for storing output value of the swallow adder group; and a main division register for storing the integer dividing ratio.

BRIEF DESCRIPTION OF THE DRAWINGS

The aforementioned aspects and other features of the present invention will be explained in the following description, taken in conjunction with the accompanying drawings, wherein:

FIG. 1b and FIG. 1c are waveforms for describing the operation and variations in the difference of the phases of the divider shown in FIG. 1a;

DETAILED DESCRIPTION OF PREFERRED EMBODIMENTS

Figure 1A:
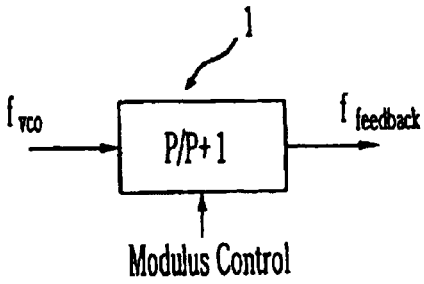
FIG. 1A (PRIOR ART)
FIG. 1a is a block diagram for describing a conventional narrow-band delta-sigma fractional type divider.
Figure 1B:
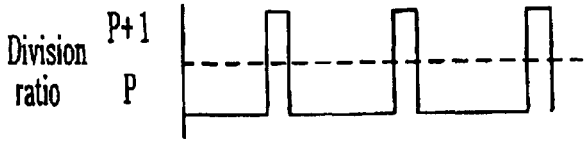
FIG. 1B (PRIOR ART)
Figure 1C:
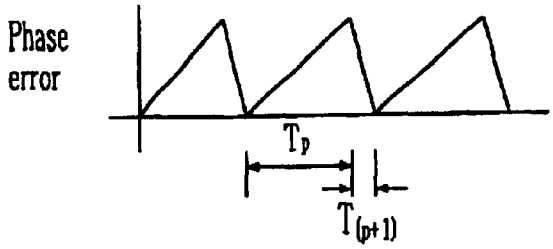
FIG. 1C (PRIOR ART)
Figure 2A:
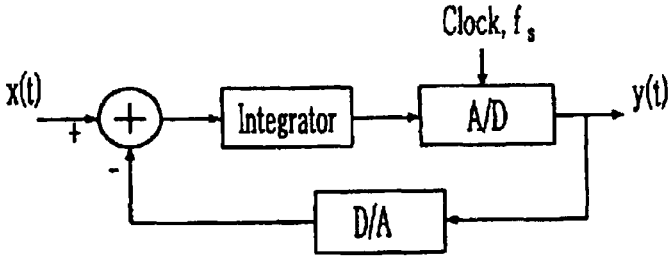
FIG. 2A (PRIOR ART)
FIG. 2(a)–FIG. 2(c) are block diagrams for describing a first order delta-sigma modulator.
Figure 2B:
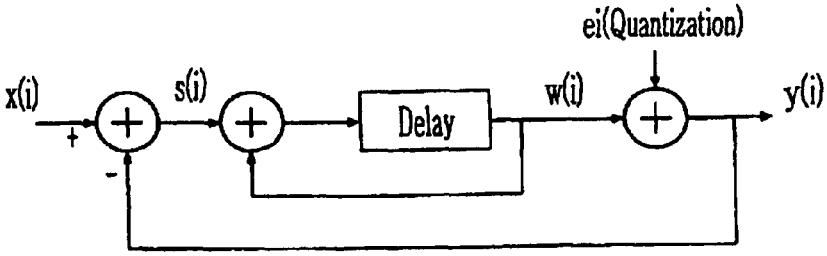
FIG. 2B (PRIOR ART)
Figure 2C:
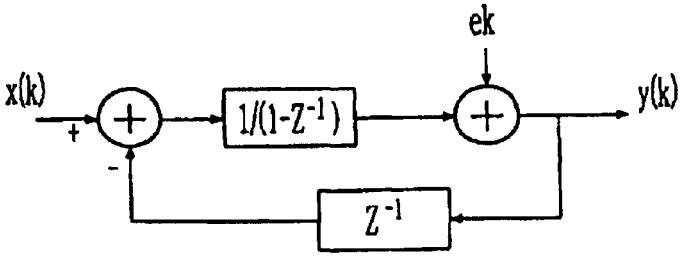
FIG. 2C (PRIOR ART)
Figure 3:
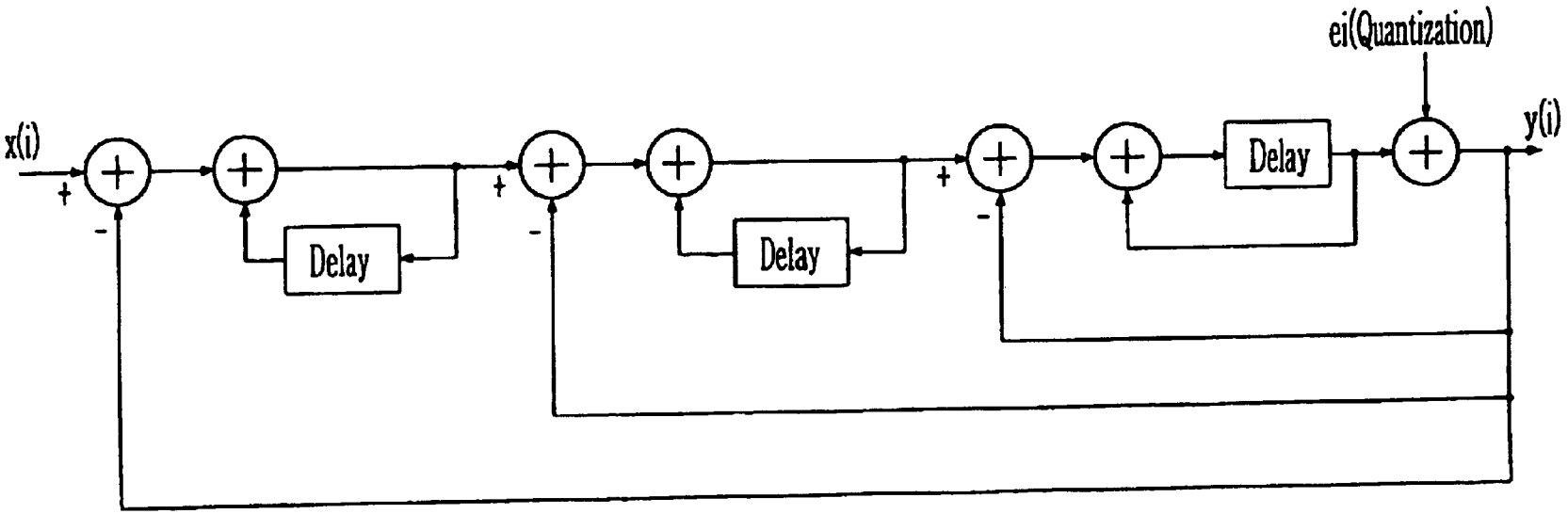
FIG. 3 (PRIOR ART)
FIG. 3 is a block diagram for describing a third order multi-loop delta-modulator.
Figure 4:
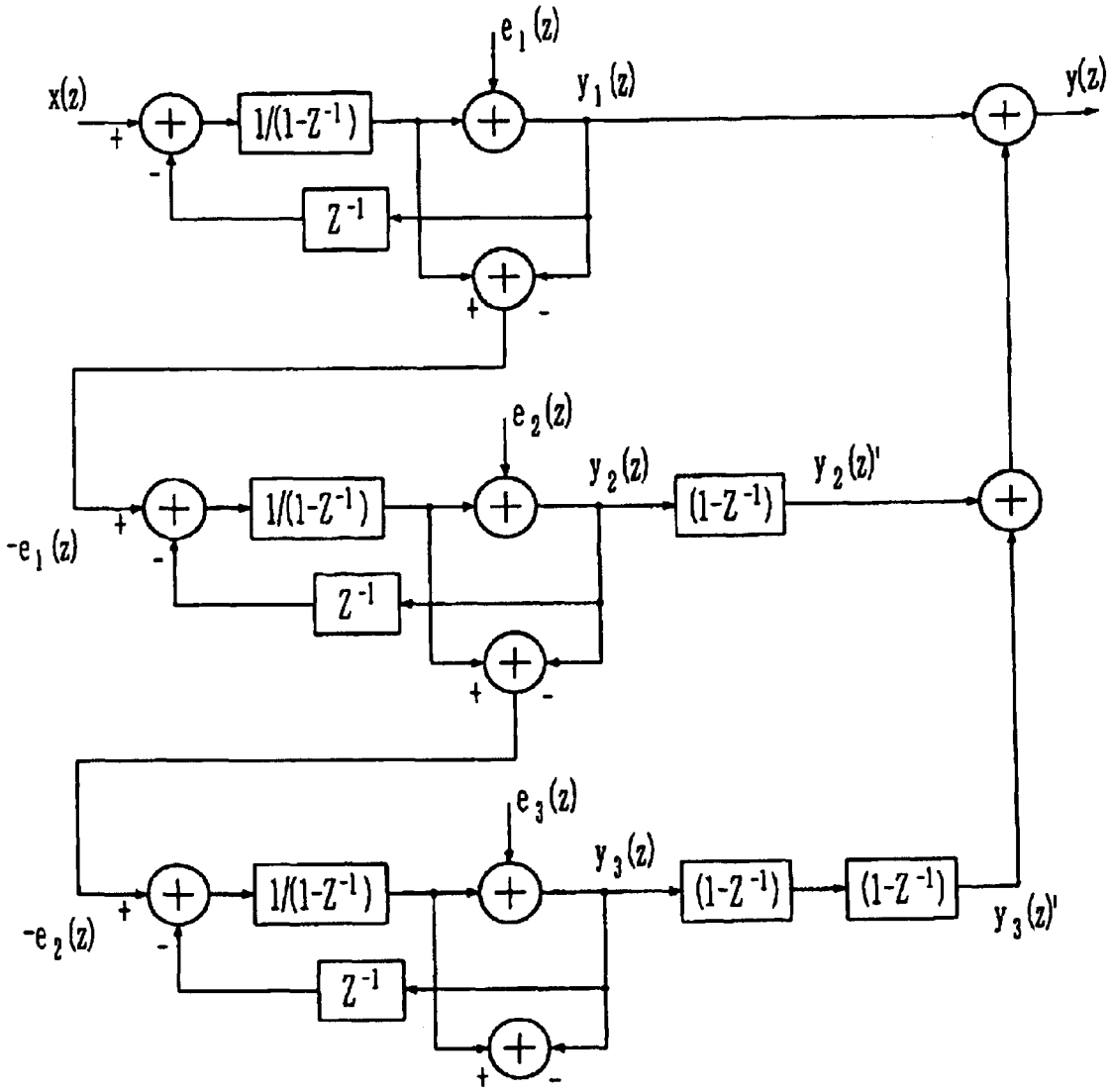
FIG. 4 (PRIOR ART)
FIG. 4 is a block diagram for describing a third order mash-type delta-sigma modulator.
Figure 5:
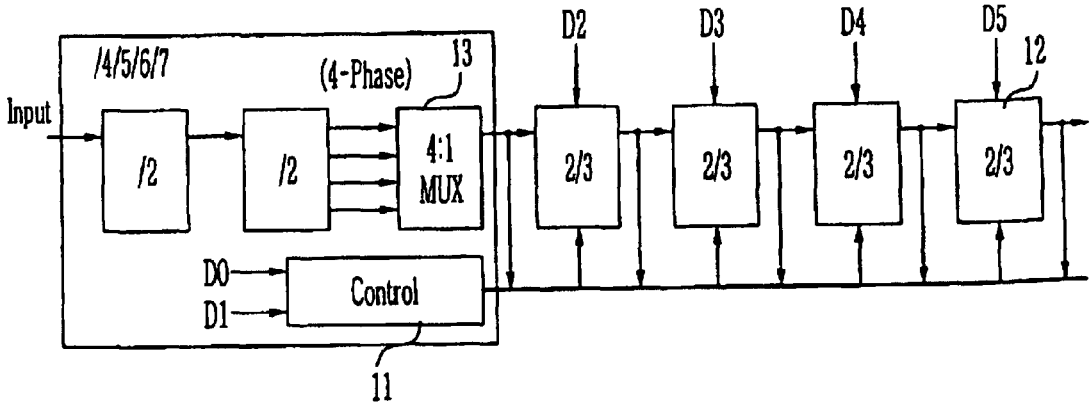
FIG. 5 (PRIOR ART)
FIG. 5 is a block diagram for describing a multi-modulus divider using a direct conversion counter.

The present invention will be described in detail by way of a preferred embodiment with reference to accompanying drawings, in which like reference numerals are used to identify the same or similar parts.

Figure 6:
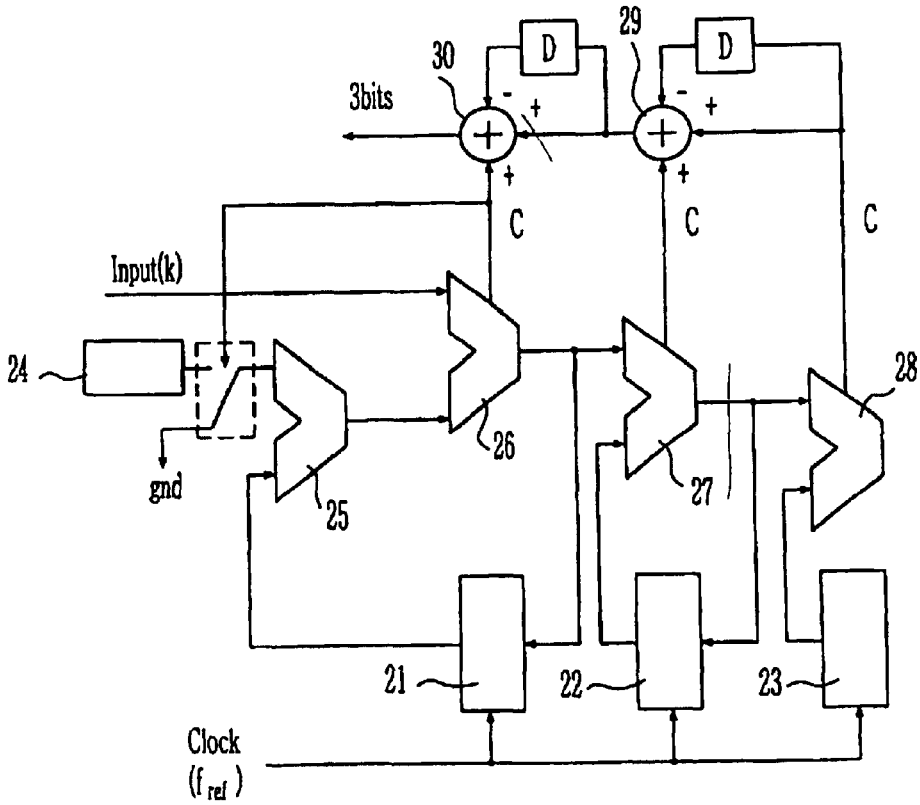
FIG. 6 is a block diagram for describing a third order mash-type delta-sigma modulator.

FIG. 6 is a block diagram of a third order mash-type delta-sigma modulator using an adder.

The modulator includes registers 21~23 that are driven by a clock ($F_{ref}$), an adder 25 for adding an output of the register 21 and an output of a preset register 24, an adder 26 for adding an input K and an output of the adder 25 to produce a carry C, an adder 27 for adding an output of the adder 26 and an output of the register 22, an adder 28 for adding an output of the adder 27 and an output of the register 23, a synthesizer 29 for receiving the carry C from the adders 27 and 28 and a delayed value, and a synthesizer 30 for receiving the carry C from the adder 26 and an output of the synthesizer 29 to produce a 3-bit multi-modulus prescaler control signal.

In the third order delta-sigma structure, a block for giving offset in order to obtain an exact frequency resolution of 5 KHz against an input frequency 9.84 MHz of a phase frequency detecter (hereinafter PFD) is added. As an adder of a delta sigma has a modulus of $2^m$, the adder could not allow a given input frequency to have a desired frequency turning resolution. Therefore, if a resolution of 10 KHz is to be obtained when input frequency is 9.84 MHz, the bit width of the adder is 10 bit and the adder is offset by 40. Thus, a resolution corresponding to 1 bit can become exactly 10 KHz. In FIG. 6, the output range of the third order delta-sigma modulator is −3, −2, −1, 0, 1, 2, 3 and 4. Therefore, for a smooth operation of the dividing circuit, a value of less 3 as an external program value of the swallow counter is not allowed. Further, a signed adder is used since the output of the third order delta-sigma is positive and negative values.

The present invention can implement a structure in which frequency of the fractional ratio of the wide band can be mixed and the in-band noise can vary by maximum, by simply applying all the range of 3 bit width outputted from the mash-type structure shown in FIG. 6 to a pulse swallow counter used in an existing integer N division mode.

Figure 7:
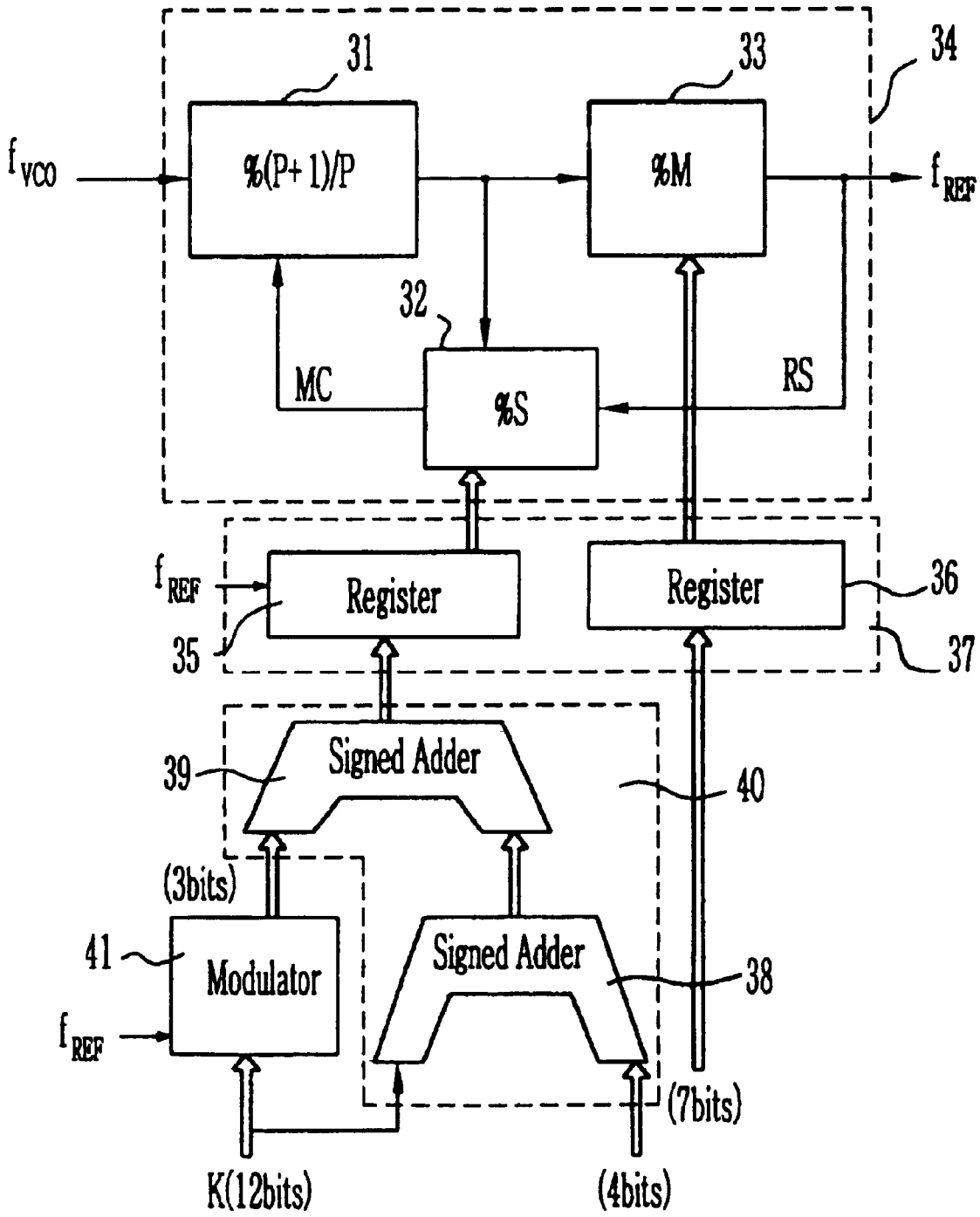
FIG. 7 is a block diagram for describing a wide-band delta-sigma fractional type divider according to the present invention.

FIG. 7 is a block diagram for describing a swallow-controlled wide-band delta-sigma fractional type divider according to the present invention. The divider comprises a pulse swallow counter group 34, a program register group 37, a swallow adder group 40 and a third order delta-sigma modulator 41.

The pulse swallow counter group 34 includes a dual modulus prescaler 31 for receiving a signal having frequency $f_{vco}$, a program counter 33 for outputting a signal having frequency $f_{REF}$ depending on the output of the dual modulus prescaler 31, and a swallow counter 32 for supplying a modulus control signal MC to the dual modulus prescaler 31 depending on the output of the dual modulus prescaler 31 and a reset signal RS.

The program register group 37 includes a swallow register 35 for outputting a signal to the swallow counter 32 depending on the frequency ($f_{REF}$) from the program counter 33, and a main division register 36 for outputting a signal to the program counter 33 depending on a signal (7 bit) from the outside.

The swallow adder group 40 includes an adder 38 for receiving given values (12 bit and 4 bit), and an adder 39 for receiving an output value of the delta-sigma modulator 41 and an output value of the adder 38 to produce a given value to the swallow register 35.

In the frequency synthesizer of the present invention, an input frequency ($f_{VCO}$) of PFD is 9.84 MHz, the prescaler 31 is 8/9, the program counter 33 has 7 bit width and the swallow counter 32 has 4 bit width. The input of the modulator 41 is 12-bit width including a sign bit, and has a frequency resolution of $(1/2^{11})*F_{ref}$. In the sign bit, the output fractional value of the modulator ranges from −0.5~0.5 through a program.

The pulse swallow counter group 34 having the dual modulus prescaler 31, the swallow counter 32 and the program counter 33, has the same structure and operation to an existing integer type fractional type divider. In other words, if K=0, the input of the swallow counter 32 is inputted with external programmed digital value since the output of the third order delta-sigma modulator 41 is always 0. Thus, in case that the integer type frequency synthesizer is to be used, K=0 is set and a clock of the modulator is precluded, so that additional power consumption by the modulator can be obviated. In this case, the following equation is satisfied:

$$f_{VCO}=[(P+1)\times S+P\times(M-S)]\times f_{REF}=f_{REF}\times[(P\times M+S),\ K=0$$

Figure 8A:
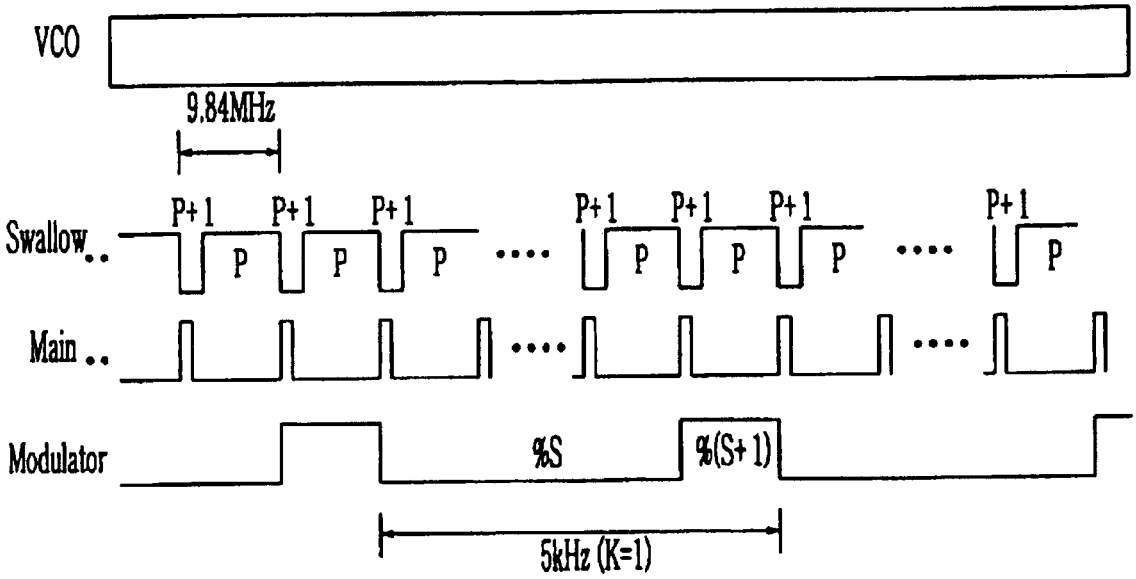
FIG. 8(a) and FIG. 8(c) are waveforms for describing an operation of the swallow counter.
Figure 8B:
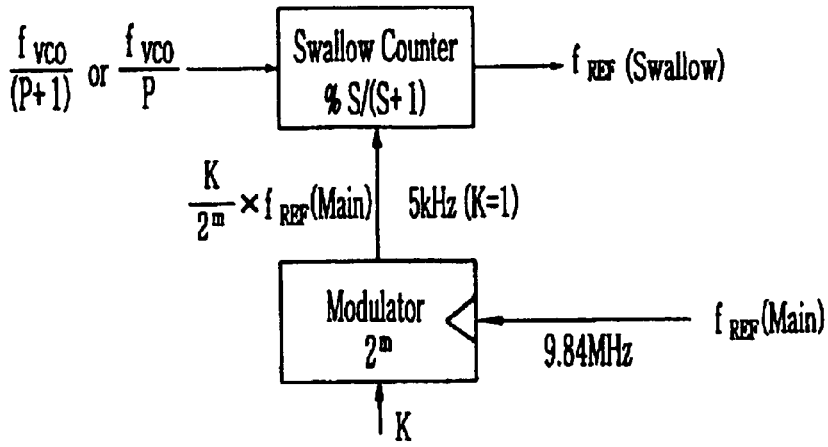
FIG. 8(b) is a block diagram of a shallow counter.
Figure 8C:
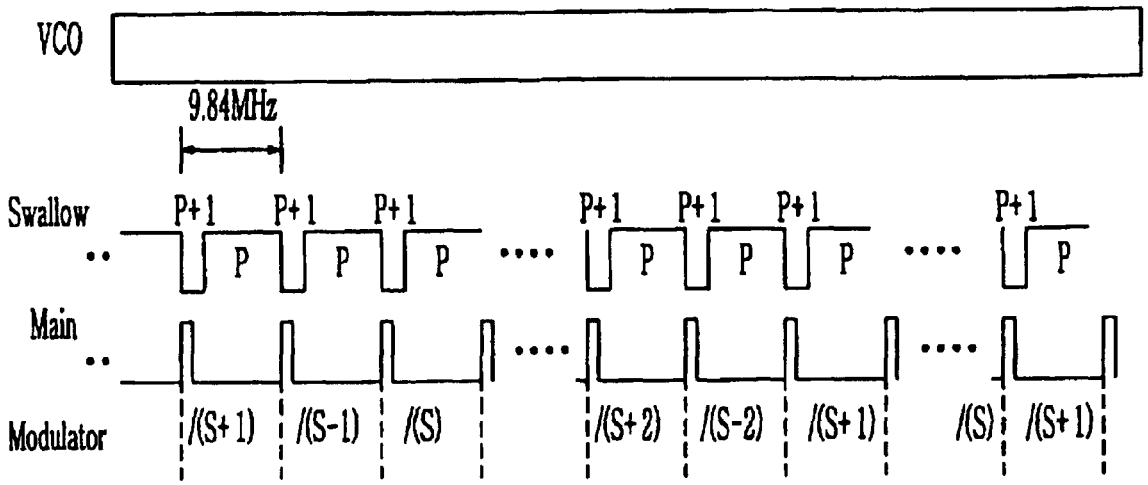

FIG. 8(a) and FIG. 8(c) are waveforms for describing an operation of the swallow counter, and FIG. 8(b) is a block diagram of a shallow counter.

FIG. 8(a) shows waveforms for describing a process of controlling the swallow counter using an output of a first order delta-sigma modulator.

In the mash-type structure, a carry output of a first adder determines an average fractional value of the entire division N structure. Second and third adders take an average from an error period occurring at the first adder and then further disperse the noise as the order is higher to send the result to a high frequency region. Therefore, it could be seen that the frequency mixing of the fractional ratio can be found by monitoring swallow control of the first order modulator.

As shown in FIG. 8(a), the output of the modulator divides the swallow counter by S for a given time and (S+1) for another given time, so that an average fractional value can be obtained. This process is same to periodic generation of a phase error due to the division operation such as the first order delta-sigma mode. If it is used intact, there occurs a high spur at the output of the VCO. However, the output of the third order delta-sigma in FIG. 8(c) is added to an external program value of the swallow counter as shown in FIG. 7 according to every $f_{ref}$. Thus, spur can be dispersed as the operation such as FIG. 8(b) and an effect of noise shaping can be obtained. The frequency output of the fractional ratio obtained depending on control of the swallow counter can be demonstrated below:

$$F_{REF}=\frac{F_{OSC}}{R}$$

$$F_{VCO}=\left\{\frac{(2^m-k)\cdot[(P+1)\cdot S+P\cdot(M-S)]+k\cdot[(P+1)\cdot(S+1)+P\cdot(M-(S+1))]}{2^m}\right\}\times f_{REF}$$

$$=\left\{\frac{2^m\cdot[(P+1)\cdot S+P\cdot(M-S)]+k}{2^m}\right\}\times f_{REF}$$

$$=\left[P\times M+S+\frac{k}{2^m}\right]\times f_{REF}$$

Or $$=\left[(P+1)\times\left(S+\frac{k}{2^m}\right)+P\times\left(M-\left\{S+\frac{k}{2^m}\right\}\right)\right]\times f_{REF}$$

$$=\left[P\times M+S+\frac{k}{2^m}\right]\times f_{REF}$$

Through the above equation, the driving circuit having the dual modulus prescaler, the swallow counter and the program counter is constituted and the fractional ratio N can be obtained by a software method. This allows data of delta-sigma to be made by a software programming and data is updated by synchronizing it to the swallow register at a clock of $f_{ref}$. Thus, the same result to the structure proposed by the present invention can be obtained. The proposed software control method can reduce the area of a chip and convert existing RF hardware to a software.

As an existing delta-sigma fractional type divider requires a multi-modulus dividing circuit, the divider is complicated and is difficult to design in order to control the dividing circuit using multi-bit. As mentioned above, however, the present invention modulates the values of the swallow counter by adding an external input value to the output value of the delta-sigma modulator. Therefore, the present invention can obtain an effect of a delta-sigma mode while having a wide-band frequency mixing capability. More particularly, the present invention has the following advantages while using an existing mash-type delta-sigma modulator.

First, the design can be simplified by simply applying multi-bit outputs of the modulator to the pulse swallow counter used in a integer type division mode.

Second, an existing pulse swallow counter can be used as the fractional type frequency synthesizer by controlling it in software, and Third, the spur of an oscillator can be reduced by maximum using the multi-bit output range of the mash type delta-sigma while having an precise frequency resolution.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A delta-sigma fractional type divider, comprising:

a delta-sigma modulator for receiving a clock signal and a first digital value to perform a delta-sigma modulation, said first digital value being used to program a fractional ratio frequency of a frequency synthesizer;

a swallow adder group for receiving an output value of said delta-sigma modulator and a second digital value to add an integer dividing ratio of a swallow counter and said output value of said delta-sigma modulator, said second digital value being used to program an integer ratio frequency of the frequency synthesizer;

a program register group for storing an output value of said swallow adder group; and a pulse swallow counter group having a dual modulus prescaler, a program counter and said swallow counter, for dividing an input frequency depending on said value stored by said program register group.

2. The delta-sigma fractional type divider as claimed in claim 1, wherein said swallow adder group comprises:

a first adder for adding the integer dividing ratio of the swallow counter and a sign value; and a second adder for adding the output value of said delta-sigma modulator and an output value of said first adder.

3. The delta-sigma fractional type divider as claimed in claim 2, wherein said sign value is the most significant bit of said first digital value used to program the fractional ratio frequency of the frequency synthesizer.

4. The delta-sigma fractional type divider as claimed in claim 1, wherein said program register group further comprises:

a swallow register for storing said output value of said swallow adder group; and a main division register for storing the integer dividing ratio.

*5. A delta-sigma fractional type divider, comprising:*

*a modulator configured to use a first digital value to program a fractional ratio frequency of a frequency synthesizer;*

*an adder group configured to use an output value of said modulator and a second digital value, said second digital value being used to program an integer ratio frequency of the frequency synthesizer;*

*a program register group configured to store an output value of said adder group; and*

*a counter group configured to divide an input frequency depending on said value stored by said program register group.*

*6. The delta-sigma fractional type divider as claimed in claim 5, wherein said adder group comprises:*

*a first adder operable to add an integer dividing ratio of a counter and a sign value; and*

*a second adder operable to add the output value of said modulator and an output value of said first adder.*

*7. The delta-sigma fractional type divider as claimed in claim 6, wherein said sign value is a most significant bit of said first digital value used to program the fractional ratio frequency of the frequency synthesizer.*

*8. The delta-sigma fractional type divider as claimed in claim 5, wherein said program register group further comprises:*

*a register operable to store said output value of said adder group; and*

*a main division register operable to store the integer dividing ratio.*

*9. The delta-sigma fractional type divider as claimed in claim 5 wherein said modulator is a delta-sigma modulator and wherein said second digital value represents an integer dividing ratio of a counter.*

*10. The delta-sigma fractional type divider as claimed in claim 5 wherein the counter group comprises a dual modulus prescaler, a program counter and a counter, for dividing an input frequency depending on said value stored by said program register group.*

*11. A method for delta-sigma fractional type dividing comprising:*

*receiving a clock signal and a first digital value to perform a delta-sigma modulation, said first digital value being used to program a fractional ratio frequency of a frequency synthesizer;*

*adding an integer dividing ratio of a counter and an output value of said modulator to produce a second output value;*

*receiving a second digital value to program an integer ratio frequency of the frequency synthesizer;*

*storing the second output value using a program register group; and*

*dividing an input frequency depending on said value stored by said program register group.*

*12. The method of claim 11 wherein the adding an integer dividing ratio comprises:*

*adding an integer dividing ratio of the counter and a sign value; and*

*adding the output value of said modulator and an output value of said adding an integer dividing ratio of the counter and a sign value.*

*13. The method of claim 12, wherein said sign value is a most significant bit of said first digital value used to program the fractional ratio frequency of the frequency synthesizer.*

*14. The method of claim 11, further comprising:*

*storing said second output value in a register; and*

*storing the integer dividing ratio in a main division register.*

*15. The method of claim 11 wherein said modulator is a delta-sigma modulator.*

* * * * *

UNITED STATES PATENT AND TRADEMARK OFFICE

CERTIFICATE OF CORRECTION

PATENT NO. : RE 40,424 E
APPLICATION NO. : 11/318392
DATED : July 8, 2008
INVENTOR(S) : Seon-Ho Han et al.

It is certified that error appears in the above-identified patent and that said Letters Patent is hereby corrected as shown below:

On the Title Page

Item [75] Inventors
Delete "Seon-Ho" and insert --Seon Ho-- therefor.
Delete "Jang-Hong" and insert --Jang Hong-- therefor.
Delete "Jae-Hong" and insert --Jae Hong-- therefor.
Delete "Hyun-Kyu" and insert --Hyun Kyu-- therefor.

Signed and Sealed this

Sixth Day of January, 2009

JON W. DUDAS
*Director of the United States Patent and Trademark Office*